(12) United States Patent
Bill

(10) Patent No.: US 6,449,190 B1
(45) Date of Patent: Sep. 10, 2002

(54) ADAPTIVE REFERENCE CELLS FOR A MEMORY DEVICE

(75) Inventor: Colin S. Bill, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/764,965

(22) Filed: Jan. 17, 2001

(51) Int. Cl.[7] .............................................. G11C 16/00
(52) U.S. Cl. ............................ 365/185.2; 365/185.24; 365/210
(58) Field of Search ........................ 365/185.2, 185.24, 365/185.22, 210

(56) References Cited

U.S. PATENT DOCUMENTS

| | | | | |
|---|---|---|---|---|
| 5,650,966 A | * | 7/1997 | Cleveland et al. ........ | 365/185.2 |
| 5,654,918 A | * | 8/1997 | Hammick .............. | 365/185.24 |
| 5,784,314 A | * | 7/1998 | Sali et al. ................. | 365/185.2 |
| 5,828,601 A | * | 10/1998 | Hollmer et al. ......... | 365/185.22 |
| 5,886,927 A | * | 3/1999 | Takeuchi ................ | 365/185.22 |
| 6,078,518 A | * | 6/2000 | Cueuallier ............... | 365/185.2 |
| 6,094,368 A | * | 7/2000 | Ching .......................... | 365/49 |
| 6,205,056 B1 | * | 3/2001 | Pan et al. .............. | 365/185.22 |
| 6,222,768 B1 | * | 4/2001 | Hollmer ................ | 365/185.16 |
| 6,269,022 B1 | * | 7/2001 | Ra .......................... | 365/185.24 |

\* cited by examiner

Primary Examiner—Tan T. Nguyen

(57) ABSTRACT

A memory device is provided with reference cells that can be adapted to the core cells of the memory device. An erase verify reference cell. is adapted to the core cells by changing the threshold voltage of the erase verify reference cell until substantially all the core cells pass an erase verification test. A program verify reference cell is then setup by changing the threshold voltage of the program reference cell by a desired change in voltage between erased and programmed states. A read reference cell is also setup by changing the threshold voltage of the read reference cell so that it is intermediate of the erase verify reference cell and the program verify reference cell.

34 Claims, 3 Drawing Sheets

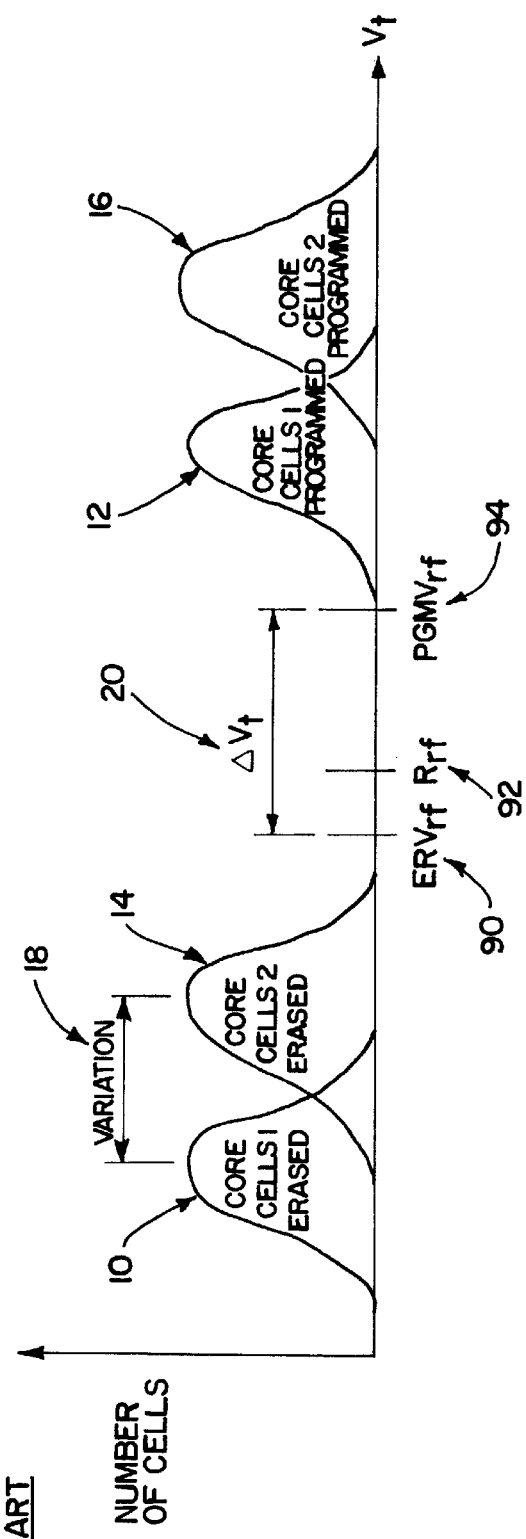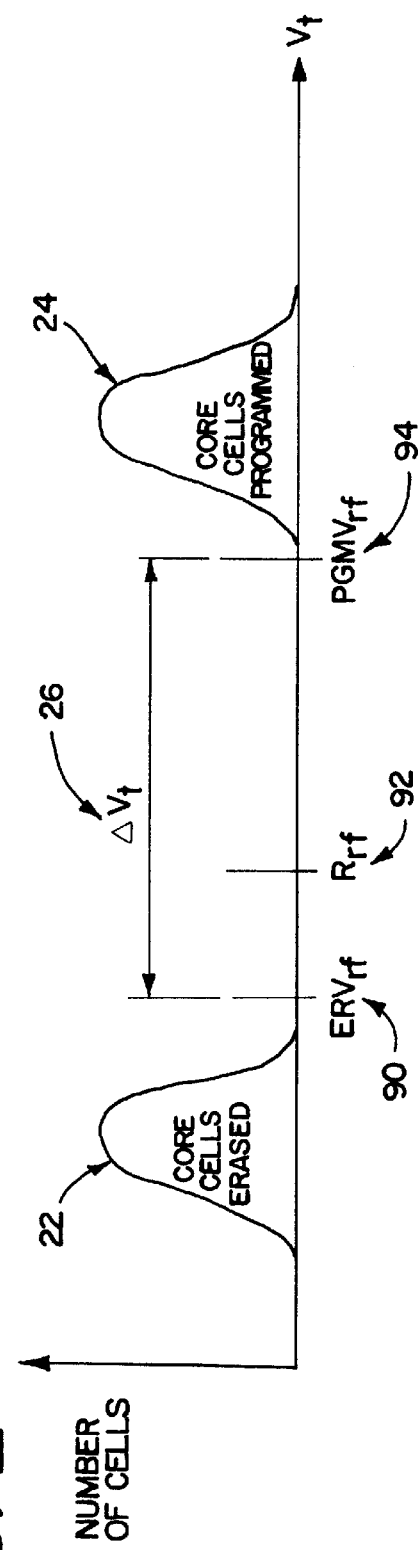
FIG. 1 PRIOR ART
FIG. 2

ADAPTIVE REFERENCE CELLS FOR A MEMORY DEVICE

BACKGROUND

Electronic devices generally include at least one processor and a memory device. Typically, the memory device is used by the electronic device to store data and instructions for the processor. A variety of memory devices are available in the art, including such common examples as Read Only Memory (ROM), Read Access Memory (RAM) and flash memory. Additionally, each of these examples is available in several different versions to satisfy differing design considerations that may be important in particular applications.

Recently, flash memory devices have found growing commercial success in the electronic device market. This commercial success is due in part to the ability of flash memory devices to store electronic data over long periods of time without an electric power supply. In addition, flash memory devices can be erased and programmed by the end user after they are installed in an electronic device. This combined functionality is especially useful in electronic device applications, such as cellular telephones, personal digital assistants, and computer BIOS storage, and other applications where power supply is intermittent and programmability is desired.

Like other types of memory devices, flash memory devices typically include an array of individual memory transistors that are oriented in rows and columns. This array is sometimes referred to as the core, and the memory transistors are often referred to as cells, or core cells. As is common practice in the memory device art, the control gates of the memory cells in each row of the core are usually connected to a series of word lines, thus forming individual rows of cells that can be accessed by selecting the corresponding word line. Similarly, the drain regions of the cells in each column of the core are connected to a series of bit lines, thus forming individual columns of cells that can be accessed by selecting the corresponding bit lines. Finally, the source regions of all of the cells in the array are connected to a common source line. In some flash memory devices the array of transistors is further subdivided into sectors of separate transistor arrays to provide added flexibility for the programming and erasing operations.

The data stored in each memory cell represents a binary 1 or 0, as is well known in the art. To perform a program, read or erase operation on a particular cell in the array, various predetermined voltages are applied to the control gate, drain region and source region of the memory cell. Thus, by applying these predetermined voltages to a particular bit line column, a particular word line row and the common source line, an individual cell at the intersection of the bit line and word line can be selected for reading or programming.

In one common type of flash memory device, non-volatility of the memory cells is achieved by adding a floating gate between the control gate and the substrate region of the transistors. Typically, the cells of the flash memory device are programmed by applying a predetermined raised voltage to the control gate and the drain region of the cell and grounding the source region. As a result, the voltages on the control gate and the drain region cause the generation of hot electrons that are injected onto the floating gate, where they become trapped. This electron transfer mechanism is often referred to as Channel Hot Electron (CHE) injection. When the programming voltages are removed, the negative charge on the floating gate remains, thereby raising the threshold voltage of the cell. The threshold voltage is then used during reading operations to determine if the cell is in a charged state, i.e., programmed (0), or whether the cell is in an uncharged state, i.e., erased (1).

Cells are read by applying a lower predetermined voltage to the control gate and the drain region and grounding the source of the cell. The current in the bit line is then sensed with a sense amplifier. If the cell is programmed, the threshold voltage will be relatively high and the bitline current will be zero, or at least relatively low, thus registering a binary 0. On the other hand if the cell is erased, the threshold voltage will be relatively low and the bit line current will be relatively high, thus registering a binary 1.

In contrast to the programming procedure, flash memory devices are usually bulk-erased by simultaneously erasing all the cells in a memory sector. One procedure for erasing an entire memory sector involves applying predetermined voltages to the common source line and all the word lines of the sector while the drain regions of the cells are left to float. This causes electron tunneling from the floating gate to the source region through Fowler-Nordheim (F-N) tunneling, thereby removing the negative charge from the floating gate of each of the cells in the memory sector.

Typically, the memory device is provided with a number of address pins that allow the user to specify individual groups of memory cells for various operations. As is well-known in the art, the number of address pins usually provided for selecting the rows of cells is equal to $\log_2 X$, where X is the number of word lines in the memory device. Similarly, the number of address pins provided for selecting column groups of cells is equal to $\log_2 Y$, where Y is the number of bytes or words in each row of cells (a byte being eight cells and a word being sixteen cells). When the memory device is performing internal embedded functions, the address bits for the row and column bits will generally be generated by a state machine within the memory device instead of being provided by the user through the address pins. The memory device also provides a number of data pins for inputting and outputting the data stored in the core cells. Commonly, the number of data pins is equal to the number of cells in the column groups that are selected by the column address bits, e.g., eight or sixteen.

In order to translate the row and column address bits into the specific word lines and bit lines that must be selected for an operation, an X-decoder and a Y-decoder are usually provided in the memory device. As is well-known in the art, the X-decoder receives the row address bits and connects the selected word line that corresponds to the address signal to the appropriate circuits. For example, in the case of a reading operation, the X-decoder will connect the selected word line to a voltage boosting circuit.

Likewise, the Y-decoder receives the column address bits and connects the selected bit lines that correspond to the address signal to the appropriate circuits. Thus, in reading operations, the Y-decoder will connect each of the selected bit lines to a sense amplifier.

Typically, memory devices are also provided with a number of reference cells. Reference cells are well known in the art and are commonly used in a variety of comparing functions which compare the reference cell to the status of the core cells. One example of a reference cell is an erase verify reference ("$ERV_{rf}$") cell. The $ERV_{rf}$ cell is used during erasing operations to verify that each of the core cells have been successfully erased. Thus, the threshold voltage ("$V_t$") of the $ERV_{rf}$ cell is compared with each of the previously erased core cells to verify that the $V_t$ of each core cell is less than the $V_t$ of the $ERV_{rf}$ cell.

Similarly, a program verify reference ("PGMV$_{rf}$") cell is also commonly provided in the memory device. The PGMV$_{rf}$ cell is used during programming operations to verify that each of the core cells have been successfully programmed. In contrast to the erase verify operation, the programming verify operation compares the V$_t$ of the PGMV$_{rf}$ cell with each of the previously programmed core cells to verify that the V$_t$ of these cells is higher than that of the PGMV$_{rf}$ cell. Generally, the V$_t$ of the PGMV$_{rf}$ cell is higher than the V$_t$ of the ERV$_{rf}$ cell, with the difference between the V$_t$ of the PGMV$_{rf}$ cell and the ERV$_{rf}$ cell representing a minimum change in V$_t$ ("ΔV$_t$") between programmed and erased states. Typically, the ΔV$_t$ may be about 2 V.

Another reference cell that is normally provided is a read reference ("R$_{rf}$") cell. The V$_t$ of the R$_{rf}$ cell is usually somewhere between the V$_t$ of the PGMV$_{rf}$ cell and the ERV$_{rf}$ cell. In one example, the V$_t$ of the R$_{rf}$ cell is about 0.5 V higher than that of the ERV$_{rf}$ cell. Accordingly, the R$_{rf}$ cell is used in a comparing function with the core cells to determine whether each of the cells is in a programmed or erased state.

Typically, predetermined fixed values for the V$_t$ of each of the reference cells is selected by the memory device designer prior to manufacturing the memory devices. In selecting these fixed V$_t$ values, the memory device designer must take into account the amount of variation that occurs in the initial V$_t$ of the core cells during manufacturing of the memory devices. The designer must also consider the amount of time that will be required to adjust the V$_t$ of the core cells during set up of the memory device so that all the cells have a V$_t$ below the predetermined fixed value of V$_t$ for the ERV$_{rf}$ cell. In some memory devices, however, the time required to adjust the V$_t$ of the core cells can be especially time consuming. Furthermore, some types of memory devices have a limited capacity to adjust the V$_t$ of the core cells. In these cases the ΔV$_t$ may become unacceptably small and may affect the performance of the memory device after the expected manufacturing variations are factored in when predetermining the V$_t$ value of the reference

BRIEF SUMMARY

A memory device setup procedure is provided for adapting reference cells to core cells. One advantage of this procedure is that the initial threshold voltages of the core cells do not need to be changed during setup of the memory device. In one stage of the method, an erase verify reference cell is adapted to the core cells until substantially all of the core cells have threshold voltages less than the threshold voltage of the erase verify reference cell. In another stage of the method, a program verify reference cell is setup by increasing the threshold voltage of the program verify reference cell by a desired change in voltage above the threshold voltage of the erase verify reference cell. A read reference cell is setup by changing the threshold voltage of the read reference cell so that it is intermediate between the erase verify reference cell and the program verify reference cell. Comparing circuits are also provided for changing the threshold voltages of the reference cells to the desired levels.

BRIEF DESCRIPTION OF SEVERAL VIEWS OF THE DRAWINGS

The invention, including its construction and method of operation, is illustrated more or less diagrammatically in the drawings, in which:

FIG. 1 is a chart of the prior art, showing the threshold voltages of core cells and reference cells from a memory device;

FIG. 2 is a chart, showing the threshold voltages of core cells and adaptive reference cells;

DETAILED DESCRIPTION

Figure 3:
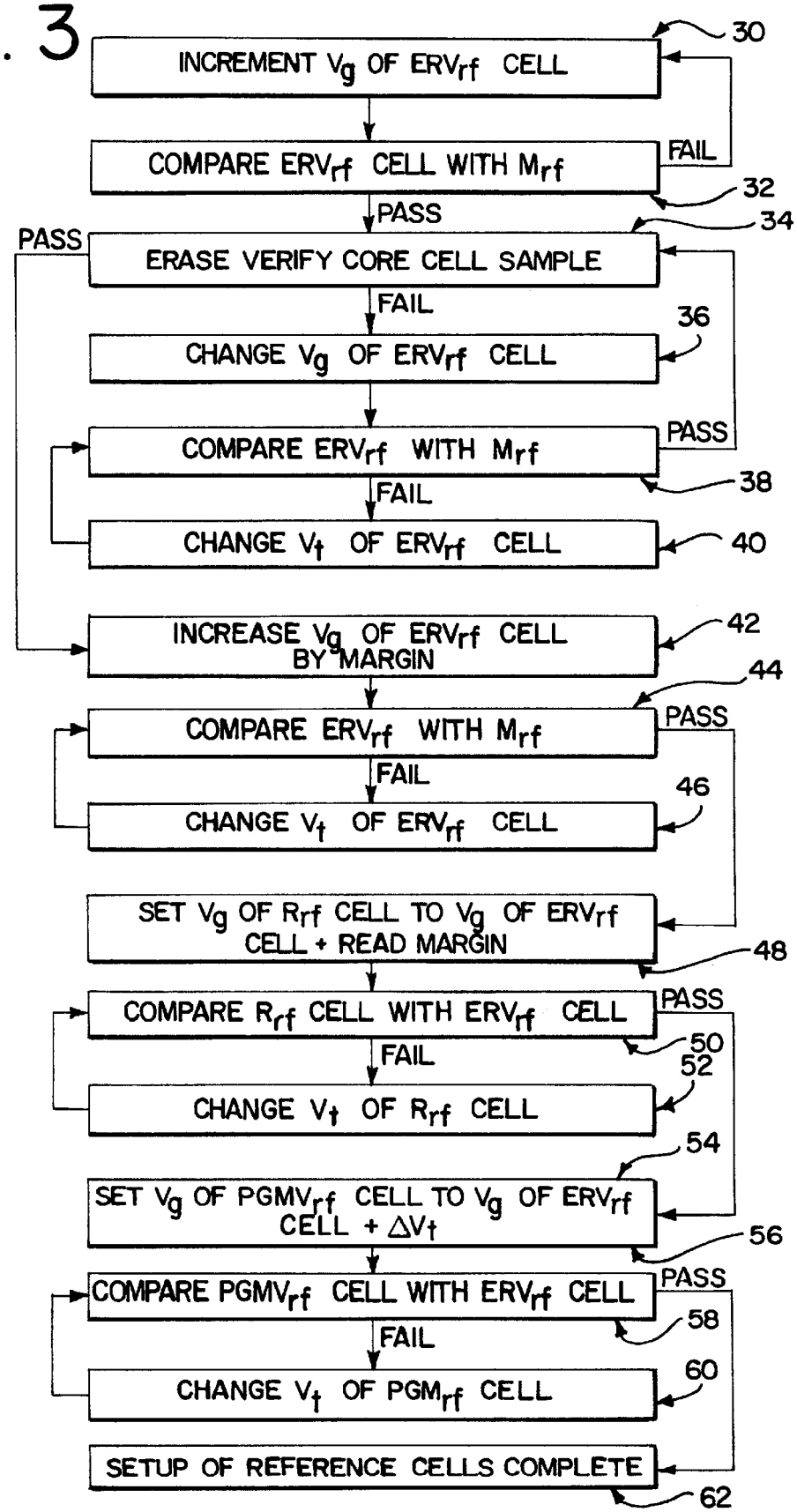
FIG. 3 is a flow chart, showing a method for adapting the reference cells to the core cells.

Referring now to the drawings, and particularly to FIG. 1, a chart is shown to demonstrate the relationship between the threshold voltage ("V$_t$") of the core cells 10, 12, 14, 16 in a memory array and the reference cells 90, 92, 94. FIG. 1 shows the prior art, in which the V$_t$ of the first group of core cells 10, 12 from one memory device varies from a second group of core cells 14, 16 from another memory device. As is well known by those skilled in the art, manufacturing variations cause a variation 18 in the initial V$_t$ of the core cells 10, 14 between different memory devices.

Typically, the core cells of the memory device are changed to a programmed state by applying various voltages to the gate, drain region and source region of each of the cells, thereby resulting in an increase in the V$_t$ of the programmed cells 12, 16. Thus, in FIG. 1 the first group of core cells 10, 12 and the second group of core cells 14, 16 are also shown in programmed states 12, 16 with their V$_t$ increased. Since the increase in V$_t$ between erased states 10, 14 and programmed states 12, 16 is generally constant for all the core cells, the initial variation 18 between the V$_t$ of the first group 10 and the second group 14 of core cells remains after the cells are programmed 12, 16.

The use of reference cells is generally known by those in the memory device art. In the present embodiment, three separate reference cells 90, 92, 94 are provided. The first reference cell, erase verify reference ("ERV$_{rf}$"), 90 is used during erase operations in a limit test to verify that all of the erased core cells 10, 14 have been properly erased. Accordingly, during erase verification each erased core cell 10, 14 is compared to the ERV$_{rf}$ cell 90. If an erased core cell 10, 14 passes less electrical current through the core cell 10, 14 than the ERV$_{rf}$ cell 90, the core cell 10, 14 is determined to be in a more programmed state than the ERV$_{rf}$ cell 90. Thus, the ERV$_{rf}$ cell 90 is used as an upper limit in the verification test.

Likewise, the program verify reference ("PGM$_{rf}$") cell 94, or second reference cell, is used as a lower limit to verify that the core cells 12, 16 are properly programmed. Thus, each programmed core cell 12, 16 is compared with the PGM$_{rf}$ cell 94 during programming verification to ensure that the core cells 12, 16 are not in a more erased state than the PGMV$_{rf}$ cell 94. The difference between erased states 10, 14 and programmed states 12, 16 of the core cells can be represented as a change in V$_t$ ("ΔV$_t$") 20. Therefore, the ΔV$_t$ 20 extends between the limits provided by the ERV$_{rf}$ cell 90 and the PFMV$_{rf}$ cell 94. Typically, a ΔV$_t$ 20 of about 2 V is preferred for flash memory devices.

The third reference cell, read reference ("R$_{rf}$"), 92 is used during reading operations to determine whether a selected core is in an erased state 10, 14 or a programmed state 12, 16. Accordingly, the R$_{rf}$ cell 92 is compared with the selected core cell. If the core cell passes more electrical current through the core cell than is passed through the $R_{rf}$ cell 92, the core cell is determined to be in an erased state 10, 14. On the other hand, when the opposite comparison occurs, the core cell is determined to be in a programmed state 12, 16. In other words, when the core cell is in an erased state 10, 14, the $V_t$ of the core cell will be less than the $V_t$ of the $R_{rf}$ cell 92. Similarly, when the core cell is in a programmed state 12, 16, the $V_t$ of the core cell will be higher than the $V_t$ of the $R_{rf}$ cell 92.

Typically, the value of $V_t$ for all three reference cells 90, 92, 94 is predetermined by the memory device designer. Therefore, the $V_t$ values are usually fixed during the design of the memory device and are not changed for each memory device as they are manufactured. However, because the initial $V_t$ of the core cells 10, 14 varies from memory device to memory device, this variation 18 must be accounted for to ensure that all the core cells have a $V_t$ value below the $V_t$ of the $ERV_{rf}$ cell 90 when erased 10, 14 and a $V_t$ above the $PGMV_{rf}$ cell 94 when programmed 12, 16. Several possible solutions are available to memory device designers to ensure proper operation of the reference cells 90, 92, 94. Usually, the initial $V_t$ of the core cells 10, 14 can be changed by some degree during setup of the memory device. This usually involves applying erase pulses to the core cells 10, 14 to lower the $V_t$ of the cells 10, 14. This solution can be demonstrated in FIG. 1 by visualizing the second group of erased core cells 14 being shifted to the left towards the first group of erased core cells 10 as the erase pulses are applied. One problem with this solution is the extra amount of time that is required to apply the necessary erase pulses to achieve the desired $V_t$ shift 18 in the core cells. Moreover, in some memory devices, such as non-floating gate flash memory devices, the characteristics of the cells allows only a relatively small shift in the initial $V_t$ of the core cells. Another solution to ensure proper values for $V_t$ of the $ERV_{rf}$ cell 90 and the $PGMV_{rf}$ cell 94 is to narrow the $\Delta V_t$ 20 between the two reference cells 90, 94. This, however, is an undesirable solution because the range of $\Delta V_t$ 20 between the $ERV_{rf}$ cell 90 and the $PGMV_{rf}$ cell 94 can become so small after accounting for expected manufacturing variations in the initial $V_t$ of the core cells 10, 14 that the operating performance of the memory device can be adversely affected.

Turning now to FIG. 2, a similar chart to that of FIG. 1 is shown to demonstrate an advantage of the invention. In the present invention the $V_t$ of the reference cells 90, 92, 94 is adapted individually to each memory device during setup of the memory devices. Therefore, the $V_t$ of the reference cells 90, 92, 94 will vary depending on the initial $V_t$ of the core cells 22 of each memory device. Accordingly, as shown in FIG. 2, the initial $V_t$ values of the core cells 22 in the memory device do not need to be changed from their initial values 22. Instead, the $V_t$ of the $ERV_{rf}$ cell 90, the $R_{rf}$ cell 92 and the $PGMV_{rf}$ cell 94 are changed to appropriate values for each individual memory device. Therefore, the $V_t$ of the $ERV_{rf}$ cell 90 is changed to position it slightly above the highest $V_t$ of any of the initially erased core cells 22. Likewise, the $V_t$ of the $PGMV_{rf}$ cell 94 can be positioned so that it is slightly below the lowest $V_t$ of any of the programmed core cells 24. As a result, the time required to set up the memory device is reduced because the initial $V_t$ values of the core cells 22 do not need to be shifted by applying numerous erase pulses. A wider $\Delta V_t$ 26 is also possible because manufacturing variations that may occur between different memory devices do not need to be accounted for. In addition, this method of adapting reference cells 90, 92, 94 to individual memory devices can be used on non-floating gate flash memories, where shifting the initial $V_t$ of the core cells 22 is difficult.

Turning now to FIG. 3 in combination with FIGS. 4–7, a method to adapt the reference cells 90, 92, 94 to a memory device is shown. In the first stage 30–46, the $V_t$ of the $ERV_{rf}$ cell 90 is changed in response to the initial $V_t$ values of the core cells 22. In the first step of the method the initial $V_t$ of the $ERV_{rf}$ cell 90 is determined. This is accomplished by applying a voltage ("$V_g$") to the gate of the $ERV_{rf}$ cell 90 and incrementing $V_g$ 30 until the $ERV_{rf}$ cell 90 compares 32 with a master reference ("$M_{rf}$") 98.

Figure 4:
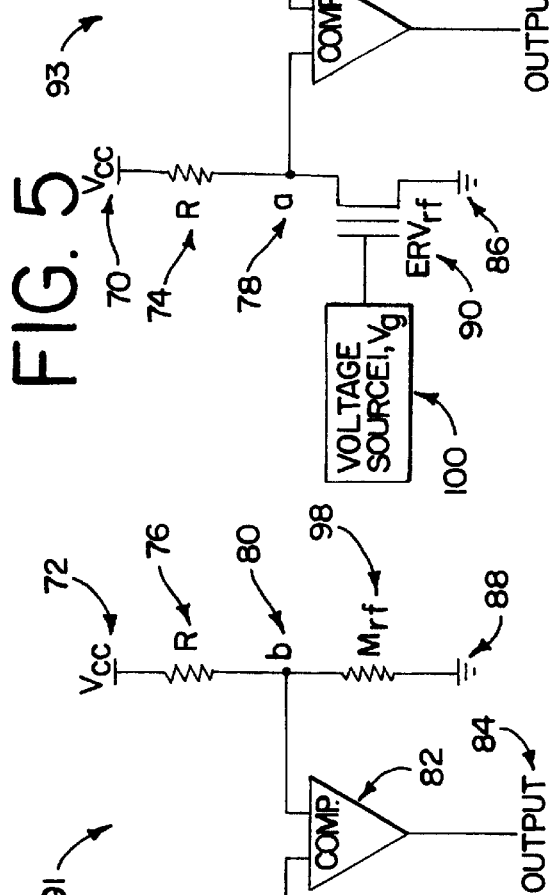
FIG. 4 is a comparing circuit for changing the threshold voltage of an erase verify reference cell.

A comparing circuit 91, or setup circuit, for the $ERV_{rf}$ cell 90 is shown in FIG. 4. Accordingly, a voltage source 96 is provided to apply $V_g$ 30 to the gate of the $ERV_{rf}$ cell 90. Various voltage sources 96 are possible, but preferably a digital to analog converter with binary weighted resistors and a four or five bit counter is used. The voltage source 96 increments $V_g$ 30 in 0.1 V increments and can remember the voltage level by storing the count used in the counter. Resistors 74, 76 are also provided between separate $V_{cc}$ nodes 70, 72 and intermediate nodes a and b 78, 80. Preferably, the resistors 74, 76 are cascode sense amplifiers with equal amounts of resistance. The $ERV_{rf}$ cell 90 is positioned between node a 78 and a ground 86. The $M_{rf}$ 98 is positioned between node b 80 and a ground 88. Preferably, the $M_{rf}$ 98 is a resistor 98 that produces a small current at node b 80. Thus, in one example, the $V_{cc}$ nodes 70, 72 have a voltage of about 3 V, and the $M_{rf}$ resistor 98 has a resistance that results in an electrical current of 4.5 $\mu$A and a voltage of 1.0 V at node b 80. Node a 78 and b 80 are then connected to a comparator 82 that generates an output signal 84 when the electrical current at node a 78 and node b 80 compare 32.

The operation of the first stage 30–46 of the method is now apparent to those skilled in the art. Initially, the $V_g$ applied 30 to the gate of the $ERV_{rf}$ cell 90 will be below the $V_t$ of the $ERV_{rf}$ cell 90. Therefore, no current flows through the $ERV_{rf}$ cell 90, and the comparator 82 does not generate an output signal 84 since nodes a and b 78, 80 do not compare 30. However, when $V_g$ is raised 30 slightly above the $V_t$ of the $ERV_{rf}$ cell 90, current begins to flow through the $ERV_{rf}$ cell 90. The current at node a 78 and node b 80 now compare 32 and the comparator 82 generates the output signal 84.

Next, an erase verify operation 34 is performed on a sample of the core cells 22. The erase verify operation 34 could be performed on all the core cells 22, but a smaller sample is selected in order to minimize the time of the erase verify operation 34. Preferably, the sample includes core cells 22 located along imaginary diagonal lines extending between the corners of the memory array. Usually, the initial erase verify operation 34 will fail because some core cells will have $V_t$ values that are higher than the $ERV_{rf}$ cell 90.

When the erase verify operation 34 fails, the $V_t$ of the $ERV_{rf}$ cell 90 is changed 36 to adapt the $ERV_{rf}$ cell to the $V_t$ values of the core cell sample 22. Thus, in the described embodiment, the voltage source 96 increases the $V_g$ 36 of the $ERV_{rf}$ cell by 0.1 V. Because $V_g$ is now greater than the $V_t$ of the $ERV_{rf}$ cell 90, more current flows through the $ERV_{rf}$ cell 90 and node a 78 than is flowing at node b 80. As a result, the comparator 82 does not generate the output signal 84; 38. The $V_t$ of the $ERV_{rf}$ cell 90 is then changed 40 until node a 78 and node b 80 compare 38. Preferably, the $V_t$ of the $ERV_{rf}$ cell 90 is changed by programming 40 the $ERV_{rf}$ cell 90 at a rate of 5 mV/$\mu$s, thereby raising the $V_t$ until the applied $V_g$ provides a current at node a 78 that is equal to the current at node b 80.

After the $V_t$ of the $ERV_{rf}$ cell 90 has been changed, the erase verify operation 34 is performed again. As before, if the erase verify operation 34 fails, the $V_t$ of the $ERV_{rf}$ cell 90 is changed again 36–40 and the erase verify operation 34 is retried. When the erase verify operation 34 passes, a $V_t$ for the $ERV_{rf}$ cell 90 has been set that is slightly higher than the highest $V_t$ from the core cell sample 22. The last $V_g$ applied 36 to the $ERV_{rf}$ cell 90 is then increased by a margin amount 42. Similar steps to those previously explained are then repeated to change 46 the $V_t$ of the $ERV_{rf}$ cell 90 and compare 44 node a 78 and node b 80 until the $V_t$ of the $ERV_{rf}$ cell 90 has been increased by the margin amount. The $V_t$ of the $ERV_{rf}$ cell 90 has now been setup and is marginally higher than all of the core cells 22.

Figure 5:
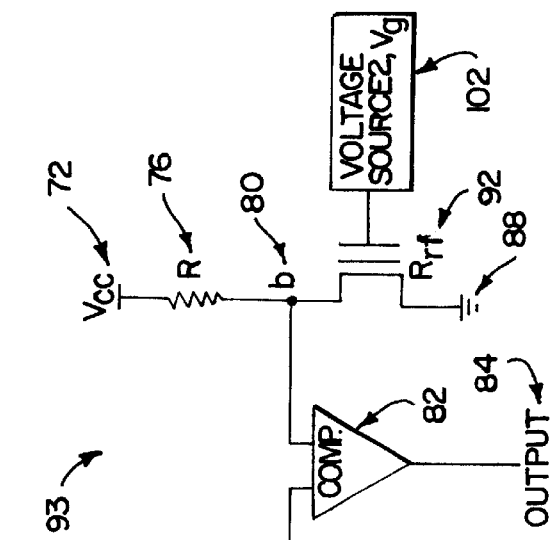
FIG. 5 is a comparing circuit for changing the threshold voltage of a read reference cell.

The next stage 48–52 of the method involves setting the $V_t$ of the $R_{rf}$ cell 92 to the appropriate value. In the preferred embodiment, the $R_{rf}$ cell 92 has a $V_t$ that is 0.5 V higher than the $V_t$ of the $ERV_{rf}$ 90 cell. Turning now to FIG. 5, an $R_{rf}$ comparing circuit 93 is shown for changing the $V_t$ of the $R_{rf}$ cell 92. FIG. 5 is similar to FIG. 4, with the $R_{rf}$ comparing circuit 93 including $V_{cc}$ nodes 70, 72, nodes a and b 78, 80, a comparator 82, the $ERV_{rf}$ cell 90 and a first voltage source 100 connected to the gate of the $ERV_{rf}$ cell 90. Unlike the $ERV_{rf}$ comparing circuit 91, the $R_{rf}$ cell 92 is connected to node b 80 and a ground 88. A second voltage source 102 is connected to the gate of the $R_{rf}$ cell 92.

The $V_t$ of the $R_{rf}$ cell 92 is then set to the desired value by simultaneously applying a $V_g$ to the gate of the $R_{rf}$ cell 92 that is 0.5 V higher than a $V_g$ applied to the gate of the $ERV_{rf}$ cell 90; 48. Preferably, the first voltage source 100 connected to the gate of the $ERV_{rf}$ cell 90 is the same voltage source 96 that was used in FIG. 4. Furthermore, the $V_g$ provided by the first voltage source 100 is preferably the last voltage 42 that was used in setting up the $ERV_{rf}$ cell 90. Because the initial $V_t$ of the $R_{rf}$ cell 92 is likely to be less than the $V_g$ applied to the gate of the $R_{rf}$ cell 92 by the second voltage source 102 (i.e., $V_g$ of first voltage source+ 0.5 V), more current will flow at node b 80 then at node a 78. Therefore, the comparator 82 will not generate the output signal 84; 50. The $V_t$ of the $R_{rf}$ cell 92 is then changed 52 by programming the $R_{rf}$ cell 92 at a rate of 5 mV/μs. Once the $V_t$ of the $R_{rf}$ cell 82 has been increased so that it is only slightly less than the $V_g$ applied to the gate of the $R_{rf}$ cell 92, the current flow at node a 28 and node b 80 will compare 50, and the comparator 82 will generate the output signal 84. Accordingly, the $R_{rf}$ cell 92 is now setup and has a $V_t$ that is 0.5 V higher than the $V_t$ of the $ERV_{rf}$ cell 90.

Figure 6:
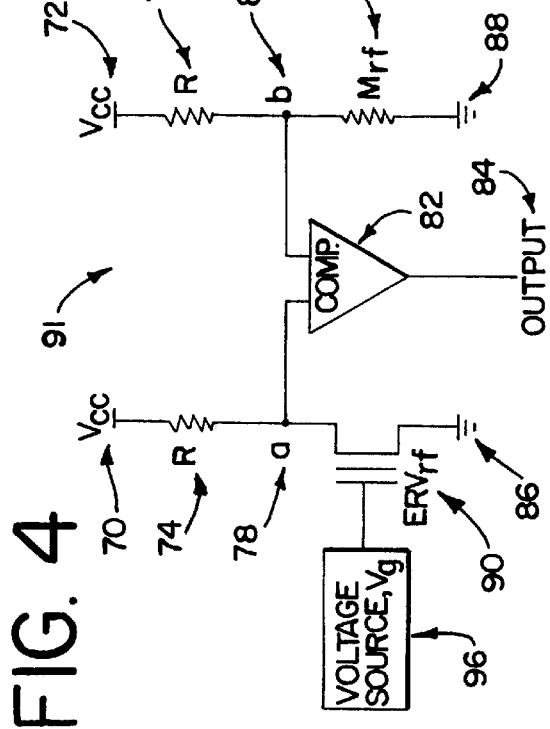
FIG. 6 is a comparing circuit for changing the threshold voltage of a program verify reference cell.

Turning now to FIG. 6, a $PGMV_{rf}$ comparing circuit 95 is shown for performing the third stage 54–60 of the method. The $PGMV_{rf}$ comparing circuit 95 functions similarly to the $R_{rf}$ comparing circuit 93 shown in FIG. 5. Thus, the first voltage source 100 preferably applies the same $V_g$ to the gate of the $ERV_{rf}$ cell 90 that was applied in FIG. 5. The second voltage source 104 then applies a $V_g$ to the gate of the $PGMV_{rf}$ cell 94 that is 2.0 V higher than the $V_g$ supplied by the first voltage source 100; 56. Like the $R_{rf}$ comparing circuit 93, the current at node b 80 will initially be more than at node a 78, thus the comparator 82 will not generate the output signal 84; 58. Therefore, the $V_t$ of the $PGMV_{rf}$ cell 94 is increased 60 by programming the cell at a rate of 5 mV/μs until the current at node a 78 and node b 80 compares 58 and the comparator 82 generates the output signal 84. Accordingly, the $PGMV_{rf}$ cell 94 is now setup and has a $V_t$ that is 2.0 V higher than the $V_t$ of the $ERV_{rf}$ cell 90. All three reference cells 90, 92, 94 have now been setup and are adapted to the $V_t$ values of the core cells 22, 24; 62.

Figure 7:
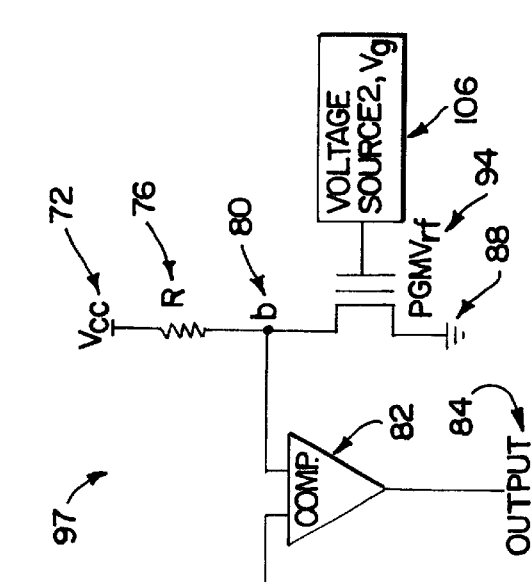
FIG. 7 is an alternative comparing circuit for changing the voltage of the program verify reference cell.

Turning now to FIG. 7, an alternative $PGMV_{rf}$ comparing circuit 97 is shown. This alternative circuit 97 is similar to the $PGMV_{rf}$ comparing circuit 95 shown in FIG. 6, but instead the $M_{rf}$ resistor 98 is substituted in place of the $ERV_{rf}$ cell 90 and the first voltage source 100. In this embodiment the $V_g$ applied to the gate of the $PGMV_{rf}$ cell 94 by the voltage source 106 is 2.0 V higher than the last $V_g$ 42 that was applied to the gate of the $ERV_{rf}$ cell 90 during setup of the $ERV_{rf}$ cell 90; 54. Like the previous $PGMV_{rf}$ comparing circuit 95, the $V_t$ of the $PGMV_{rf}$ cell 94 is then changed 60 until the current at node a 78 and node b 80 compare 58. As is apparent to those skilled in the art, a similar alternative circuit could be provided to setup the $R_{rf}$ cell 92.

While a preferred embodiment of the invention has been described, it should be understood that the invention is not so limited, and modifications may be made without departing from the invention. The scope of the invention is defined by the appended claims, and all devices that come within the meaning of the claims, either literally or by equivalence, are intended to be embraced therein.

I claim:

1. A memory device comprising a memory bank with a plurality of memory cells, each memory cell having a threshold voltage; a first reference cell having a threshold voltage; a verification circuit adapted to fail when a portion of said memory cells have threshold voltages higher and another portion of said memory cells have threshold voltages lower than said first reference cell threshold voltage; and a first reference cell setup circuit adapted to change said first reference cell threshold voltage in response to said verification failure until said verification circuit passes.

2. The memory device according to claim 1 wherein said first reference cell setup circuit comprises a comparator; said first reference cell being coupled to said comparator and a master reference being coupled to said comparator; wherein a changeable voltage source is coupled to said first reference cell thereby changing the threshold voltage of said first reference cell in response to said verification circuit; and said comparator generating an output signal when a current adjacent said first reference cell compares with a current adjacent said master reference thereby signaling that the threshold voltage of said first reference cell has been changed to a desired level.

3. The memory device according to claim 2 wherein said changeable voltage source increments a voltage applied to a gate of said first reference cell and a programming circuit is coupled to said first reference cell thereby changing the threshold voltage of said first reference cell.

4. The memory device according to claim 3 wherein said changeable voltage source is a digital to analog converter.

5. The memory device according to claim 2 wherein said master reference is a resistor.

6. The memory device according to claim 2 wherein said master reference is another reference cell, a voltage applied to a gate of said master reference being different than a voltage applied to a gate of said first reference cell.

7. The memory device according to claim 2 wherein said first reference cell setup circuit further comprises a first resistor coupled to $V_{cc}$ and a first node and a second resistor coupled to $V_{cc}$ and a second node; said master reference being coupled to said first node and a ground and said first node being coupled to said comparator; and said first reference cell being coupled to said second node and a ground and said second node being coupled to said comparator.

8. The memory device according to claim 7 wherein said first resistor and said second resistor are cascode sense amplifiers.

9. The memory device according to claim 1 further comprising a second reference cell having a threshold voltage and a second reference cell setup circuit, said second reference cell setup circuit adapted to change said second reference cell threshold voltage after said verification circuit passes by a desired change in threshold voltage from said first reference cell threshold voltage.

10. The memory device according to claim 9 further comprising a third reference cell having a threshold voltage and a third reference cell setup circuit, said third reference cell setup circuit adapted to change said third reference cell threshold voltage to an intermediate value between said first reference cell and said second reference cell.

11. The memory device according to claim 10 wherein said first reference cell is an erase verify reference cell and said verification circuit is an erase verification circuit, said erase verification circuit adapted to pass when substantially all of said plurality of memory cells have threshold voltages less than said erase verification reference cell threshold voltage; wherein said second reference cell is a program verify reference cell, said plurality of memory cells having threshold voltages higher than said program verify reference cell threshold voltage when said memory cells are programmed; and wherein said third reference cell is a read reference cell, said read reference cell threshold voltage being used to determine whether said plurality of memory cells are erased or programmed by comparing whether the threshold voltages of said memory cells are less than or higher than said read reference cell threshold voltage.

12. The memory device according to claim 1 wherein said plurality of memory cells are flash memory cells.

13. The memory device according to claim 12 wherein said plurality of flash memory cells are non-floating gate flash memory cells.

14. The memory device according to claim 12 wherein said first reference cell setup circuit comprises a comparator; said first reference cell being coupled to said comparator and a master reference being coupled to said comparator; wherein a changeable voltage source is coupled to said first reference cell thereby changing the threshold voltage of said first reference cell in response to said verification circuit; said comparator generating an output signal when a current adjacent said first reference cell compares with a current adjacent said master reference thereby signaling that the threshold voltage of said first reference cell has been changed to a desired level; further comprising a second reference cell having a threshold voltage and a second reference cell setup circuit, said second reference cell setup circuit adapted to change said second reference cell threshold voltage after said verification circuit passes by a desired change in threshold voltage from said first reference cell threshold voltage; wherein said first reference cell is an erase verify reference cell and said verification circuit is an erase verification circuit, said erase verification circuit adapted to pass when substantially all of said plurality of memory cells have threshold voltages less than said erase verification reference cell threshold voltage; and wherein said second reference cell is a program verify reference cell, said plurality of memory cells having threshold voltages higher than said program verify reference cell threshold voltage when said memory cells are programmed.

15. The memory device according to claim 14 wherein said master reference of said first reference cell setup circuit is a resistor; and wherein said second reference cell setup circuit comprises a comparator, said second reference cell being coupled to said comparator and said first reference cell being coupled to said comparator, wherein a voltage applied to a gate of said second reference cell is different than a voltage applied to a gate of said first reference cell, said comparator generating an output signal when a current adjacent said second reference cell compares with a current adjacent said first reference cell thereby signaling that the threshold voltage of said second reference cell has been changed to a desired level.

16. The memory device according to claim 15 wherein said changeable voltage source increments a voltage applied to a gate of said first reference cell and a programming circuit is coupled to said first reference cell thereby changing the threshold voltage of said first reference cell; wherein said first reference cell setup circuit further comprises a first resistor coupled to $V_{cc}$ and a first node and a second resistor coupled to $V_{cc}$ and a second node, said master reference being coupled to said first node and a ground and said first node being coupled to said comparator, and said first reference cell being coupled to said second node and a ground and said second node being coupled to said comparator; and wherein said second reference cell setup circuit further comprises a first resistor coupled to $V_{cc}$ and a first node and a second resistor coupled to $V_{cc}$ and a second node, said second reference cell being coupled to said first node and a ground and said first node being coupled to a comparator, and said second reference cell being coupled to said second node and a ground and said second node being coupled to said comparator.

17. The memory device according to claim 16 wherein said plurality of flash memory cells are non-floating gate flash memory cells.

18. A memory device comprising means for verifying logical states of a plurality of memory cells in relation to a threshold voltage of a first reference cell; and means for changing said threshold voltage of said first reference cell until said means for verifying produces a passing result.

19. The memory device according to claim 18 wherein said means for changing said threshold voltage of said first reference cell comprises means for applying a voltage to a gate of said first reference cell; means for changing a threshold voltage of said first reference cell; and means for comparing said first reference cell with a master reference, thereby changing said threshold voltage of said first reference cell to a desired level.

20. The memory device according to claim 19 further comprising means for changing a threshold voltage of a second reference cell in relation to said first reference cell, thereby creating a difference in threshold voltage between said first reference cell and said second reference cell.

21. The memory device according to claim 20 further comprising means for changing a threshold voltage of a third reference cell, said threshold voltage of said third reference cell being intermediate of said first reference cell and said second reference cell.

22. The memory device according to claim 21 wherein said logical states of said plurality of memory cells are not changed during said changing of said threshold voltages of said first reference cell, said second reference cell, and said third reference cell.

23. A method for setting up reference cells in memory devices comprising:
verifying the logical states of a plurality of memory cells, said verifying the logical states of a plurality of memory cells producing a failed result when a portion of said memory cells have logical states more erased and a portion of said memory cells have logical states more programmed than a first reference cell; and
adapting said threshold voltage of said first reference cell to said plurality of memory cells in response to said verifying the logical states of a plurality of memory cells until said verifying produces a passed result.

24. The method as recited in claim 23 wherein said verifying the logical states of a plurality of memory cells and said adapting said threshold voltage of said first reference cell to said plurality of memory cells are performed without changing the logical states of said plurality of memory cells.

25. The method according to claim 23 wherein said first reference cell is an erase verify reference cell, said adapting comprising programming said threshold voltage of said erase verify reference cell until substantially all of said plurality of memory cells have logical states more erased than said threshold voltage of said erase verify reference cell.

26. The method according to claim 25 further comprising:

adapting a program verify reference cell to said plurality of memory cells, said adapting of said program verify reference cell comprising programming said program verify reference cell by a desired change in threshold voltage; and further comprising adapting a read reference cell to said plurality of memory cells, said adapting said read reference cell to a plurality of memory cells comprising programming said read reference cell to a threshold voltage intermediate between said threshold voltage of said erase verify reference cell and said threshold voltage of said program verify reference cell.

27. The method according to claim 23 wherein said adapting the threshold voltage of said first reference cell comprises comparing a current adjacent to said first reference cell and a current adjacent a master reference thereby changing the threshold voltage of said first reference cell.

28. The method according to claim 27 wherein said adapting step comprises changing the threshold voltage of said first reference cell.

29. The method according to claim 23 wherein said memory cells are flash memory cells.

30. The method according to claim 29 wherein said flash memory cells are non-floating gate flash memory cells.

31. The method according to claim 29 wherein said adapting said threshold voltage of said first reference cell comprises comparing a current adjacent to said first reference cell and a current adjacent to a master reference; and wherein said adapting further comprises changing said threshold voltage of said first reference cell.

32. The method according to claim 31 wherein said verifying and adapting steps are performed without changing the logical states of said plurality of memory cells.

33. The method according to claim 32 wherein said first reference cell is an erase verify reference cell, said adapting comprising programming said erase verify reference cell until substantially all of said plurality of memory cells have logical states more erased that said erase verify reference cell; further comprising adapting a program verify reference cell to said plurality of memory cells, said adapting of the program verify reference cell comprising programming said program verify reference cell by a desired change in a threshold voltage; and further comprising adapting a read reference cell to said plurality of memory cells, said adapting of said read reference cell comprising programming said read reference cell to a threshold voltage intermediate between said erase verify reference cell and said program verify reference cell.

34. The method according to claim 33 wherein said flash memory cells are non-floating gate flash memory cells.

* * * * *